United States Patent [19]
Yoshimura et al.

[11] Patent Number: 5,512,328
[45] Date of Patent: Apr. 30, 1996

[54] METHOD FOR FORMING A PATTERN AND FORMING A THIN FILM USED IN PATTERN FORMATION

[75] Inventors: Toshiyuki Yoshimura, Higashi-murayama; Naoko Miura, Kokubunji; Shinji Okazaki, Urawa; Minoru Toriumi; Hiroshi Shiraishi, both of Hachiohji, all of Japan

[73] Assignee: Hitachi, Ltd., Tokyo, Japan

[21] Appl. No.: 98,046

[22] Filed: Jul. 28, 1993

[30] Foreign Application Priority Data

Aug. 7, 1992 [JP] Japan .................................. 4-211214
Aug. 19, 1992 [JP] Japan .................................. 4-219996

[51] Int. Cl.$^6$ ........................... B05D 3/06; B05D 1/18; C08J 7/04; C08J 7/18
[52] U.S. Cl. ................... 427/498; 427/503; 427/504; 427/510; 427/512; 427/515; 427/534; 427/552; 427/553; 427/555; 427/264; 427/265; 427/407.1; 427/430.1; 216/94; 216/65; 216/66; 156/643.1
[58] Field of Search .................. 427/525, 526, 427/534, 552, 553, 555, 558, 503, 504, 510, 515, 581, 582, 583, 585, 586, 430.1, 407.1, 407.2, 412.1, 412.5, 264, 498, 265, 512, 270; 156/643, 643.1; 216/94, 65, 66

[56] References Cited

U.S. PATENT DOCUMENTS 3,666,948  5/1972  Mechlowwitz et al. .............. 250/83 R
3,843,230  10/1974  Haas et al. ............................. 350/157

(List continued on next page.)

FOREIGN PATENT DOCUMENTS 60-211828  10/1985  Japan .
60-211831  10/1985  Japan .
60-211920  10/1985  Japan .
60-211921  10/1985  Japan .
60-211922  10/1985  Japan .
60-211923  10/1985  Japan .
60-211926  10/1985  Japan .
60-211927  10/1985  Japan .
60-211928  10/1985  Japan .
60-211929  10/1985  Japan .
60-211930  10/1985  Japan .
60-211931  10/1985  Japan .

OTHER PUBLICATIONS

Yarbrough et al "Current Issues & Prob. in the CVD of diamond", *Science* vol. 247 pp. 688–696 9 Feb. 1990.
*Journal of Vacuum Science and Technology,* v. B6 1988, pp. 379–383. Jan./Feb.
Liu et al, "Characterization of a high–resolution novolak based negative e–beam resist with 4µC/Cm$^2$ sensitivity".
*Japanese Journal of Applied Physics,* Nov. 30, 1991, pp. 3277–3281. Yoshimura et al
"Fabrication of Oil µm Complementary Metal–oxide–Semiconductor Devices".
SPIE, vol. 1466, *Advances in Resist Technology and Processing VIII,* 1991, pp. 309–323. Roa et al, "The effects of Sensitizer Spatial Distribution on Dissolution Inhibition in Novolak/Diazonapthiqumone Resists" No month.
*Thin Solid Films,* 205, 1991, pp. 109–112. (no month.) Uekita et al, "Patterning of Polymidepecorsor LB films & their application as deep UV resists".
Linus Pauling, "The Nature of the Chemical Bond", 3rd ed., Cornell Univ. Press, Ithaca, N.Y. 1960 (no month)–excerpt–pp. 221–253.

Primary Examiner—Marianne Padgett
Attorney, Agent, or Firm—Fay, Sharpe, Beall, Fagan, Minnich & McKee

[57] ABSTRACT

In forming a thin film pattern, first a seed material film is formed on a substrate and then exposed using electron beam lithography, for example, in the shape of the pattern. The latent image is then removed and an oriented material is deposited on one of the seed material and the substrtate, which have different hydrophilicity properties, to form the pattern. The oriented film is formed by an LB film forming method, in one example, and in another example the LB film material is a cresol novolak resin having a proportion of p-cresol novolak to m-cresol novolak of at least 20%.

22 Claims, 12 Drawing Sheets

U.S. PATENT DOCUMENTS

| | | | |
|---|---|---|---|
| 4,539,061 | 9/1985 | Savig | 427/503 |
| 4,618,561 | 10/1986 | Munakata et al. | 430/156 |
| 4,715,929 | 12/1987 | Ogawa | 427/510 |
| 4,915,800 | 4/1990 | Nakanishi et al. | 204/35.1 |
| 5,019,451 | 5/1991 | Lando | 427/434.3 |
| 5,035,782 | 7/1991 | Tamura et al. | 427/504 |
| 5,071,694 | 12/1991 | Uekita et al. | 427/430.1 |
| 5,075,094 | 12/1991 | Morrish et al. | 427/585 |
| 5,077,085 | 12/1991 | Schnur et al. | 427/510 |
| 5,112,906 | 5/1992 | Ogata et al. | 525/61 |
| 5,114,737 | 5/1992 | Ogawa et al. | 427/503 |
| 5,161,233 | 11/1992 | Matsuo et al. | 355/218 |
| 5,194,393 | 3/1993 | Hugl et al. | 436/525 |
| 5,235,449 | 8/1993 | Imazeki et al. | 359/63 |
| 5,258,262 | 11/1993 | Erdelen et al. | 427/430.1 |
| 5,273,788 | 12/1993 | Yu | 427/581 |
| 5,324,543 | 6/1994 | Ogawa et al. | 427/407.1 |
| 5,324,548 | 6/1994 | Ogawa et al. | 427/515 |
| 5,338,579 | 8/1994 | Ogawa et al. | 427/407.2 |
| 5,366,762 | 11/1994 | Soga et al. | 427/412.1 |
| 5,368,895 | 11/1994 | Matsuda et al. | 427/430.1 |
| 5,424,098 | 6/1995 | Nishiyama et al. | 427/430.1 |
| 5,436,033 | 7/1995 | Mino et al. | 427/503 |

PROIR ART
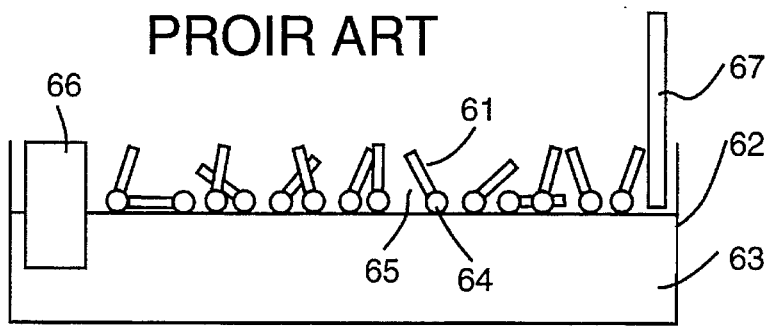
FIG. 6(a)
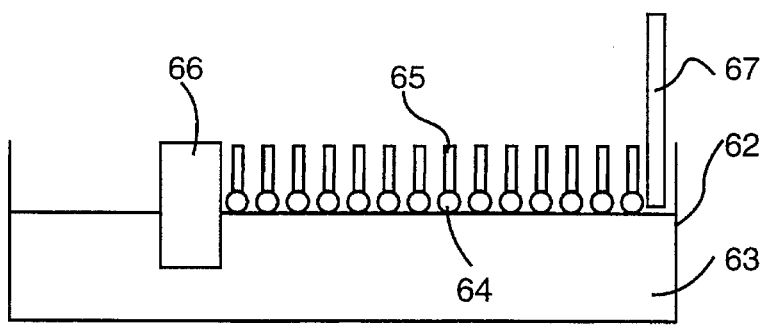
FIG. 6(b)
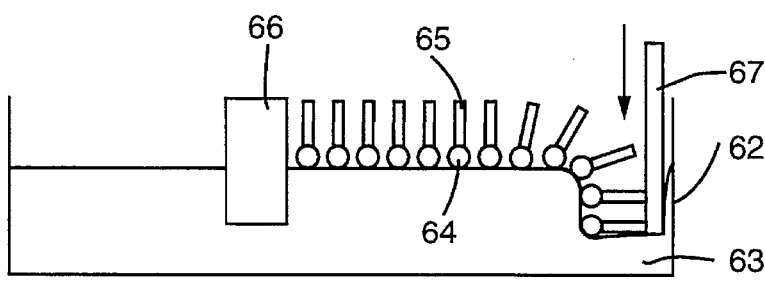
FIG. 6(c)
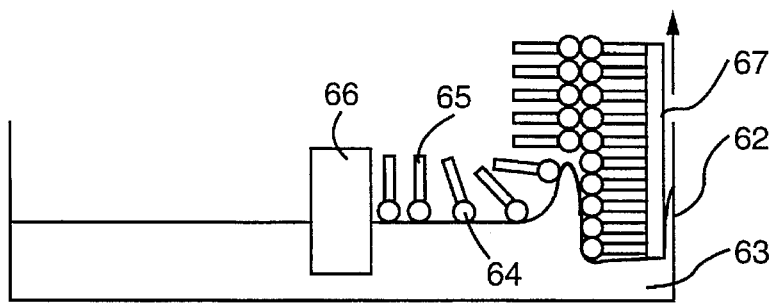
FIG. 6(d)
FIG. 6(f)
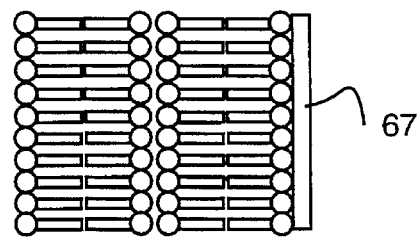
FIG. 6(e)
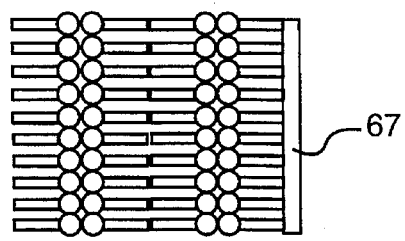

METHOD FOR FORMING A PATTERN AND FORMING A THIN FILM USED IN PATTERN FORMATION

FIELD OF THE INVENTION

The invention relates to a method for forming a pattern used in semiconductor lithography technology and to a method of forming a thin film used in pattern imaging, and more particularly to a method of forming an ultra-small pattern having a minimum feature size of about 0.1 μm (100 nm). The thin film is formed by a Langmuir-Blodgett method for controlling the thickness and molecular order of the thin film.

BACKGROUND OF THE INVENTION

FIGS. 5(a)–5(d) show sequential steps followed in forming a fine pattern by conventional semiconductor lithography technology. First, a hydrophobic treatment is applied to a semiconductor substrate 51 before an organic or inorganic thin film is coated on the substrate to form a resist. The hydrophobic treatment improves the adhesion of the resist to the substrate. Resist 52 is typically deposited by a thin-film coating method. Following the coating of the resist 52 on substrate 51, the substrate is subjected to a heat treatment to remove any solvent contained in the resist. Hereinafter this step is referred to as a baking step. For example, the baking step is performed by placing the substrate on a hot plate set at a predetermined temperature for a predetermined amount of time.

As shown in FIG. 5(b) after baking, the resist is exposed to energy beams 53, such as ultra-violet rays or electron beams, in accordance with a desired pattern to form a latent image 54 of the pattern causing a chemical change to take place in the exposed area of resist 52. The substrate is then dipped into a developer causing a chemical change to take place in the exposed area of resist 52, and due to a difference of dissolution velocity with respect to the developer for the exposed and unexposed parts of the resist, the desired pattern is formed. When the dissolution velocity of latent image portion 54 is low, the exposed portion remains and a negative type resist pattern is formed as shown in FIG. 5(c). On the other hand, when the dissolution velocity of the latent image portion 54 increases or is high, the exposed portion is dissolved and a positive type resist pattern is obtained as shown in FIG. 5(d). After forming the pattern in this way, the substrate is further processed by dry etching and selective introduction of impurity region(s) by ion implantation, for example.

As the size of the pattern to be formed becomes smaller and smaller, the dose of the energy beams required for exposure increases. That is, when the pattern to be formed has a relatively large size, a point on the resist receives a high amount of energy during exposure due to the influence of adjacent exposed areas resulting from scattering of the energy beams, and so forth. Therefore, a low dosage of the exposure beam is sufficient. On the other hand, when the formation pattern is of a small size, an exposure point on the resist is not as easily affected by adjacent exposed areas and therefore its energy does not increase. Accordingly, the dosage of exposure beams must be increased. Therefore, with the formation of smaller or finer patterns, the dosage of energy required to obtain a predetermined degree of exposure per unit area increases. To solve this problem, the sensitivity of the resist has been increased, as disclosed, for example, in "chemical amplification resist", Journal of Vacuum Science and Technology, V. B6, 379–383 (1988).

For forming a negative type resist, the exposed portions of which remain at the time of development, a skeleton-forming novolak resin is used with an acid generator and a cross linker. The acid generator contained in the exposed portion of the resist generates an acid (hydrogen ion) that functions as a catalyst at the time of baking (after exposure) to start a cross linking reaction of the novolak resin. Accordingly, the exposed portions of the novolak resin become polymeric and the solubility of them in the developer drops remarkably. Thus, the exposed pattern portions remain after development to provide the negative type pattern that is desired.

For a positive type resist, a dissolution inhibitor is used in place of the cross linker for suppressing dissolution of the novolak resin in the developer. The acid generated during exposure acts on the dissolution inhibitor during baking and functions as a catalyst to reduce the dissolution inhibiting effect by the decomposition reaction of the dissolution inhibitor. As a result, the surrounding novolak resin is dissolved in the developer and a positive type pattern is obtained.

During exposure, the cross linker or the dissolution inhibitor directly receives the energy of the exposure beams and the reaction proceeds accordingly. In the chemical amplification resist, however, energy is imparted to the acid generator. The pattern is obtained if the acid is generated and the catalytic reaction proceeds. It is known that the acid can be generated from the acid generator by applying low energy exposure of the resist. Accordingly, the chemical amplification resist has a possibility of high sensitivity to exposure.

By using a chemical amplification resist, a fine pattern of about 0.1 μm (100 nm) can be obtained with a low dosage of exposure energy beams. As described, for example in Japanese Journal of Applied Physics 30, 2377–3281 (1991), a fine pattern of the 0.1 μm level is formed using SAL 601-ER7 (a trade name of the Shipley Company). This resist is known as a negative type electron beam chemical amplification resist that is used for device fabrication.

SUMMARY OF THE INVENTION

According to the present invention, it has been determined that resists having mainly polymer organic materials, inclusive of the chemical amplification resist, have been used primarily as a pattern formation material. The size of the molecules in these polymer resists is as much as 10 nm, which is not negligible for forming an ultra fine pattern having features of a size less than about 0.1 μm (100 nm). The resist pattern is formed as these molecules are decomposed or polymerized. It is difficult to arrange these molecules in regular order in the resist by spin coating, and the molecules are believed to be arranged in the conventional resist at random. Therefore, a delicate surface corrugation of the fine pattern occurs ranging from several nm to about 10 nm that reflects the shape of the constituent molecules on the upper or side surfaces of the pattern, particularly at the end portions of the pattern.

In semiconductor processes, fluctuation of the pattern dimension is generally permitted within about ten percent of the pattern dimension. When the pattern dimension is 0.5 μm, for example, a pattern fluctuation of as much as 0.05 μm (50 nm) is permitted. The surface corrugation of the fine pattern, which reflects the shape of the constituent molecules of the resist, has only a small influence in the case of forming patterns with such a dimension. However, when ultra fine patterns having features of about 0.1 μm (100 nm) are formed, the permissible fluctuation of the dimension is about 10 nm. The size of the molecules of the polymer affects the dimension of the pattern that is formed, and the surface corrugation of the pattern, which ranges from several nm to about 10 nm, cannot be neglected. Accordingly, ultra fine pattern formation using a conventional polymer resist by suppressing the pattern surface corrugation is an object of the present invention.

Fine surface corrugation of the resist is believed to result from the disorder in arrangement of the polymer molecules having a size ranging from several nm to as much as 10 nm in the resist. According to the present invention, if the orientation of the molecules in the resist can be achieved then the surface corrugation can be suppressed or minimized. Accordingly, it is an object to suppress the surface corrugation on the upper or side surfaces of the pattern by introducing order or orientation of the molecules in the resist.

An example of a report about forming a resist film having an oriented characteristic of the molecules is described in "Thin Solid Films", 205, 109–112 (1991). Orientation of the molecules in the resist film is achieved by aligning the direction of a polyimide precursor having a hydrophilic portion and a hydrophobic portion at either end of its molecular chain. This oriented film is generally referred to as a Langmuir-Blodgett film, hereinafter referred to as an LB film.

The molecules of an LB film have a hydrophilic portion, which has a strong affinity for water, and a hydrophobic portion, having little affinity for water. Examples of the hydrophilic portion are an OH radical (hydroxyl radical) and a COOH radical (carboxyl radical), and examples of the hydrophobic radical are straight chain alkyl radicals such as a $CH_3$ radical (methyl radical) or a $C_2H_5$ radical (ethyl radical), and a cyclic $C_6H_5$ (phenyl radical). Examples of the molecules forming the LB film are the afore-mentioned polyimide precursor, normal chain fatty acids such as arachic acid and stearic acid prepared by bonding the carboxyl radical with the alkyl radical and omega-tricosenoic acid. Further phenolic resins such as constituent materials of general polymer resists have both hydrophilic and hydrophobic portions.

The normal chain fatty acids have carbon chains that are aligned on a straight line, and contain a carboxyl radical coupled at the end portion and having a low molecular weight. When such materials are used in semiconductor fabrication processes, the normal chain fatty acids are easily decomposed by energy beams, such as ion beams generated by a plasma, and therefore the normal chain fatty acids are known to have a low dry etching resistivity. On the other hand, it is known that polymers containing aromatic rings have high dry etching resistivity. Therefore, LB films of the polymers containing aromatic rings are preferred for fabrication of semiconductor devices. For example, it is disclosed in SPIE, vol. 1466, "Advances In Resist Technology and Processing VIII", 309 (1991), that the formation of an LB film with a novolak resin as a principal component of a conventional resist has been attempted. In this article it is disclosed that the object of the research is to clarify the mechanism of dissolution in condition by controlling distributions of photo-active compounds inside the resist by the LB films. As a result of a series of studies that this report describes, formation of patterns of one to two μm or so have been accomplished.

It is not discussed in the SPIE article how pattern formation at a level below 0.1 μm can be achieved, and in particular uniformity and orientation in the LB films has not been examined. Therefore, the formation of an LB film from polymers containing aromatic rings and having high uniformity and high order orientation is not disclosed, although it is desired. It is therefore one object of the present invention to accomplish the formation of a film having uniformity and high order orientation that is applicable for use in pattern formation as a high resolution resist, and in mask forming, wire pattern forming and other patterning methods involved in semiconductor technology. According to the present invention, a film having high order orientation and applicable as a high resolution resist can be obtained by controlling the proportion of p-cresol novolak and m-cresol novolak isomers in a cresol novolak resin comprising a mixture of these isomers.

FIGS. 6(a)–6(d) show the steps performed in forming an LB film, and FIGS. 6(e) and 6(f) show two types of an LB film. Generally, a monomer film is formed on the surface of a sub-phase liquid and then deposited on a substrate. First, as shown in FIG. 6(a) constituent molecules 61 dissolved in a solvent are spread across a sub-phase liquid, such as pure water charged in a tank 62. Constituent molecules 61 float on the surface of the sub-phase liquid without being dissolved therein. Each of the molecules has a hydrophilic portion 64 and a hydrophobic portion 65. To form the film, a compression board 66 is moved along in the water tank to compress the sub-phase liquid to reduce the surface area of the liquid. As the area decreases, the constituent molecules are arranged until they are oriented with their hydrophilic portions 64 in contact with the sub-phase liquid and with their hydrophobic portions 65 opposed to the surface of the sub-phase liquid, as shown in FIG. 6(b). Then, a substrate 67, which has been subjected to a hydrophobic treatment on its surface thereof, is lowered as shown in FIG. 6(c). The molecules 61 adhere with their hydrophobic portions 65 to the substrate 67. As a result, the molecules with their hydrophilic portions 64 are oriented in opposition to the substrate surface. Next, as the substrate 67 is moved upwardly, as shown in FIG. 6(d), the hydrophilic portions 64 of molecules 61 still in contact with the sub-phase liquid are forced into contact with similar hydrophilic portions 64 to form two layers of the molecules. Repeating the procedure forms another two layers of molecules 61 on the substrate surface, as shown in FIG. 6(e).

In forming an LB film according to the steps described with reference to FIG. 6(a)–6(d), the substrate 67 is first pushed into the sub-phase liquid and then pulled out again to form the LB film having molecules oriented according to the orientation shown in FIG. 6(e). However, the substrate 67 may first be subjected to a hydrophilic treatment and submerged in the sub-phase liquid 63. Thereafter, the molecules 61 are spread across the surface of the sub-phase liquid in a next step, similar to the one shown in FIG. 6(a). Then, as substrate 67 is raised vertically to start the formation of the LB film, the LB film is formed with the hydrophobic portions 65 in contact with the substrate's surface at first, and then with the other molecular layers formed as shown in FIG. 6(f).

Other LB films can be formed with arrangement alternative to those discussed with reference to FIGS. 6(e) and 6(f), as shown in FIG. 7(a)–7(c). FIG. 7(a) shows an X film wherein the first layer has a hydrophobic portion 72 contacting the substrate 71 and having its hydrophilic portion 73 in contact with a next layer's hydrophobic portion 72a, and so on. In FIG. 7(b), a Y film is shown wherein the first layer has a hydrophobic portion 75 in contact with substrate 74 and a hydrophilic portion 76 in contact with the hydrophilic portion 76a of the next layer. Hydrophobic portion 76b is then formed in contact with hydrophobic portion 75a of the second layer, and so on. By forming a wide film as disclosed in FIG. 7(b), the orientation of the molecules changes with alternate layers.

In FIG. 7(c), a Z film is shown with the first layer having its hydrophilic portion 78 contacting the substrate 77 and with its hydrophobic portion 79 contacting the hydrophilic portion 78a of the next layer.

The molecules constituting the LB film have a generally linear shape, and the effective size of the molecules in top view of the film (the molecules are assumed to have a round shape with a diameter) is less than about 2 nm. When an oriented film having such an effective small molecule size it used as a patterning material, an ultra fine pattern of less than 100 nm can be formed without the surface corrugation characteristic of resist films having a larger molecule size in top view.

When such an oriented resist is exposed to incident electron beams, when they are used as exposure beams, the energy is scattered within the resist if the thickness is large. Accordingly, it is not possible to suppress the proximity effect during exposure, which extends the effective exposed region, and there has been difficulty in improving the resolution using such films. To reduce the proximity effect, therefore, the film thickness is required to be reduced.

To accomplish this reduction in thickness, a pattern formation method is described in Japanese Patent laid-open Application Nos. 211828/1985, 211831/1985, 211920/1985, 211921/1985, 211922/1985, 211923/1985, 211926/1985, 211927/1985, 211928/1985, 211929/1985, 211930/1985 and 211931/1985, wherein a thin LB film or a conductive outside glass surface is modified by gamma rays or X-rays and the LB film is formed on only the non-modified portions. Resolution is improved by the use of such disclosed thin film resists.

FIGS. 10(a) and 10(b) illustrate the problems with using an LB film or conductive oxide glass 121 formed on a substrate 120 that is modified by energy beams 122, such as gamma rays or X-rays, to form a modified region 123. After forming region 123, the monomolecular film or the monomolecular deposited film 125 as an LB film is deposited only on the non-modified region 124, as shown in FIG. 10(b) to form the pattern. The LB film or conductive oxide glass having the modified surface is not removed even after the formation of the pattern and the material layer having a thickness of at least several nm remains. Therefore, when etching is performed using the pattern thus formed as a mask or when ion implantation is conducted, the remaining LB film or conductive oxide glass impedes these operations and affects the formation pattern and characteristics after ion implantation.

According to the present invention, the corrugation problem is recognized as occurring on the pattern surface, and one object of the invention is to overcome this problem.

To accomplish the object of the invention according to one embodiment of the invention, a pattern formation method is performed for forming a fine pattern on a substrate by first forming a thin film having surface properties different from those of the substrate; applying energy beams selectively to desired portions of the thin film and removing the thin film at the desired portions. Thereafter, an oriented material is deposited selectively to a region from which the thin film is removed or not, according to the difference of the surface properties. As an alternative, a fine pattern can be formed on a substrate by first applying energy beams selectively to desired portions of the substrate and then forming a material layer having surface properties different from those of the substrate. An oriented material is then selectively deposited on a region where the oriented material layer is formed or on a region where it has not been formed, according to the different of the surface properties.

More particularly, according to the present invention, the pattern formation is divided into two steps. In the first step, energy beams are applied to form a seed area of a pattern made of a material having molecules or basic units of ionic or covalent bond crystals, the length or width of which is smaller than that of the oriented material. These materials are hereinafter referred to generically as "low molecular materials". In forming this seed area, either a thin film is formed of a low molecular material having a different surface property from that of the substrate followed by applying energy beams selectively to desired portions and removing the thin film of the exposed portions, or applying energy beams selectively to desired portions of the substrate to form an extremely thin material layer of a low molecular material having a different surface property from that of the substrate. By these thin film forming methods, the thickness of the film or the material layer is at most one 1 nm. In the second step, the oriented material is deposited such that the portion to which the oriented material is deposited is the portion from which the thin film is removed or not removed; or the portion where the material layer is formed or not formed. According to this structure, the surface corrugation of the seed area of the pattern to be first formed is reduced because the seed area of the pattern is formed of an ultra thin film or of a material layer of low molecular material, and as a result a thinner film is used than is used conventionally. Accordingly, the proximity effect or the influence of the incident energy to the proximity portions can be reduced and resolution improved as a result. Obviously, X-rays can be used instead of electron beams for forming the seed area. Since the oriented material is used for forming the pattern after the formation of the seed area, the surface corrugation of the pattern is reduced. In addition since the seed area of the pattern is formed on the ultra thin film, energy necessary for forming the pattern is reduced and the sensitivity of the resist is improved.

By the present invention, the problem of the surface corrugation of the pattern can be avoided and an ultra-fine pattern of less than about 100 nm can be formed. The seed area is either removed or is extremely thin. Therefore, it does not render any problem for the steps following the pattern formation steps, such as dry etching and ion implantation steps.

Further, by the present invention, the formation of a film by the LB method having high uniformity and high order orientation is made possible by controlling the proportion of components of the film forming materials, particularly the p-cresol novolak and m-cresol novolak polymers, which are useful as a high resolution resist.

BRIEF DESCRIPTION OF THE DRAWINGS

FIGS. 6(a), 6(b), 6(c), 6(d), 6(e) and 6(f) explain the formation of an LB film.

DETAILED DESCRIPTION OF THE PREFERRED EMBODIMENTS

Figure 1:
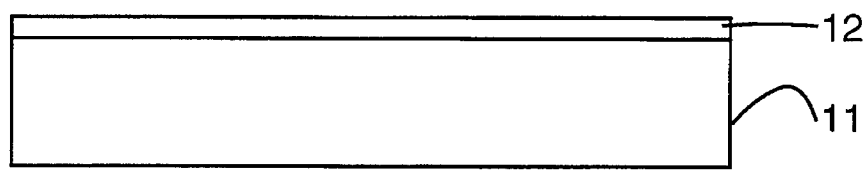
FIGS. 1(a), 1(b), 1(c) and 1(d) are diagrams useful for explaining the present invention.
Figure 1:
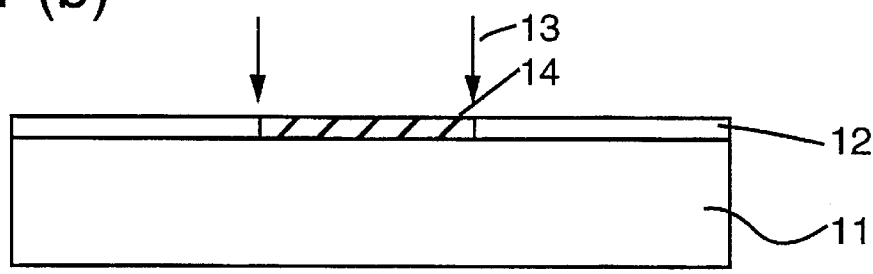
Figure 1:
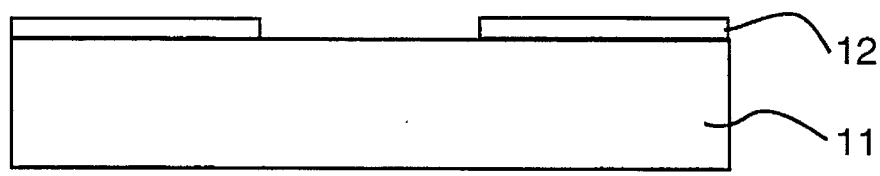
Figure 1:
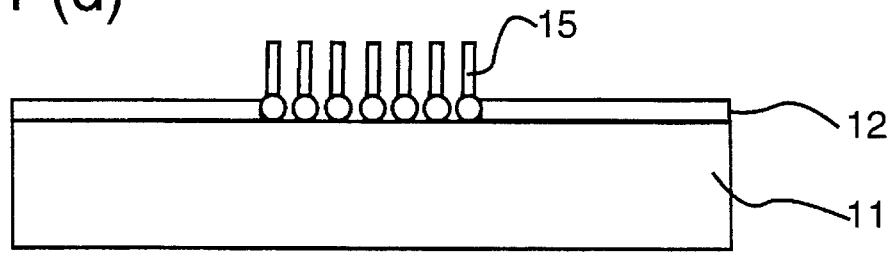

A general explanation of the present invention is provided first, followed by a detailed description of an example of the present invention. With reference to FIGS. 1 through 4, and in particular as shown in FIG. 1(a), a seed material film 12 of a low molecular material is formed on a substrate 11 to form the seed area of the pattern. Energy beams 13 are projected on the seed material film for forming the pattern, as shown in FIG. 1(b). A latent image 14 of the pattern is formed as a result of this exposure to the energy beams. The seed material film 12 is extremely thin, for example about 10 nm. The substrate and seed material film differ in hydrophilicity, which difference can be determined by measuring an angle of contact with water, for example. The latent image portion 14 of the pattern is preferably removed by scattering the seed material 12 by exposure to the energy beams 13, as shown in FIG. 1(c). In this example, the portion from which the pattern is removed and the portion from which the pattern is not removed causes a difference in hydrophilicity to appear. Then, as shown in FIG. 1(d), an oriented material 15 having hydrophilicity or hydrophobicity that matches the surface properties of the removed portion is formed on the removed portion for forming the fine pattern. When the oriented material 15 is an LB film, it can be formed by conventional LB film forming methods.

Figure 2:
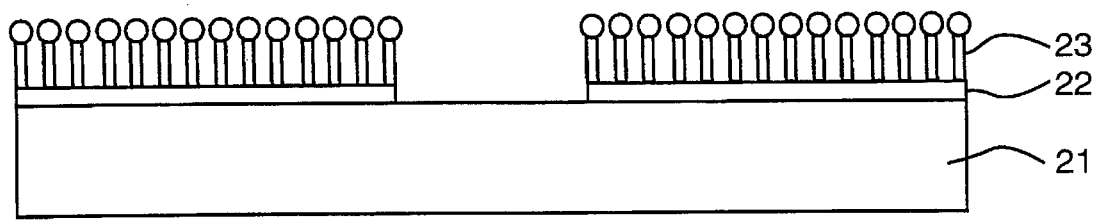
FIG. 2 is an explanatory view of the present invention.

FIG. 2 shows an alternative pattern formation wherein a seed material film portion 22 is formed on a substrate 21 and the oriented material 23 is formed on the seed material film 22, not the substrate, as in the previous method. By making both pattern formation methods available, positive and negative type patterns can be formed.

Figure 3A:
FIGS. 3(a), 3(b) and 3(c) are views useful for explaining the present invention.
Figure 3B:
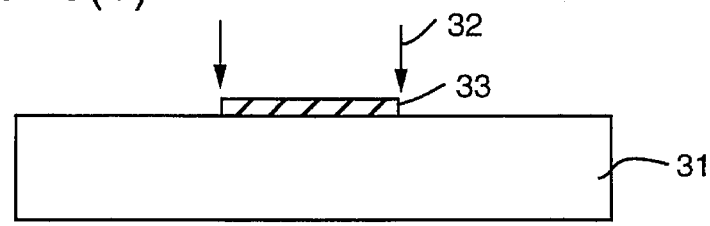
Figure 3C:
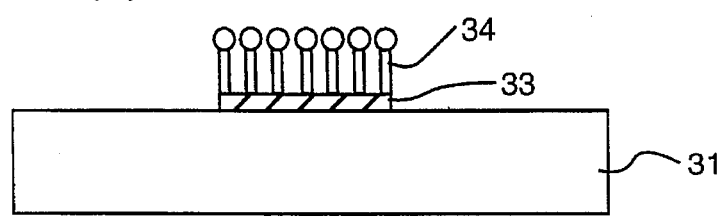
Figure 4:
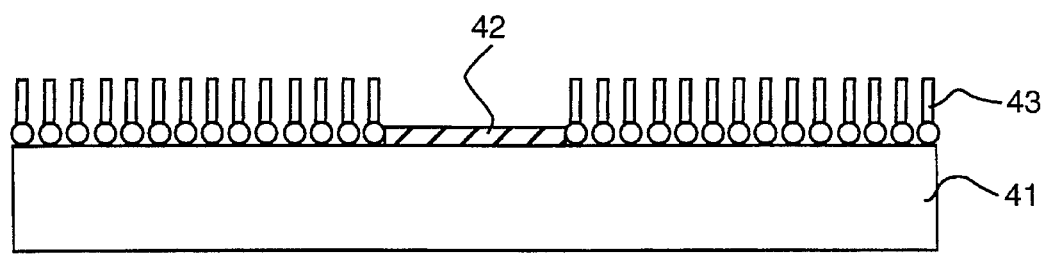
FIG. 4 is an explanatory view of the present invention.
Figure 5A:
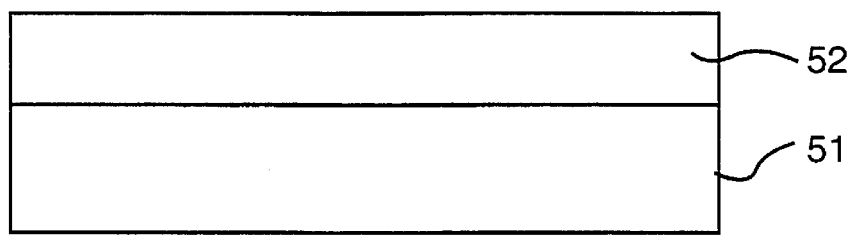
FIGS. 5(a), 5(b), 5(c) and 5(d) explain the steps followed in a conventional pattern formation method.
Figure 5B:
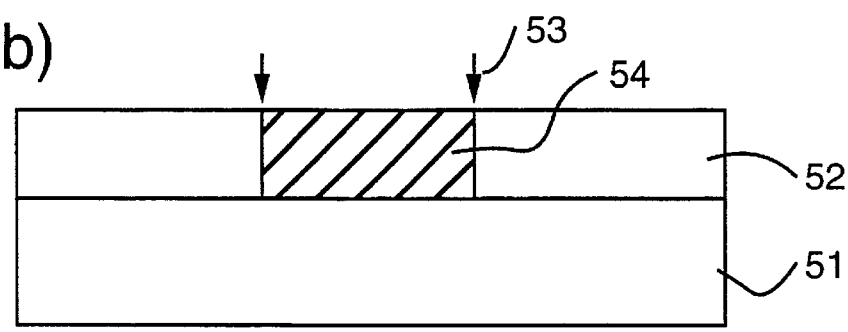
Figure 5C:
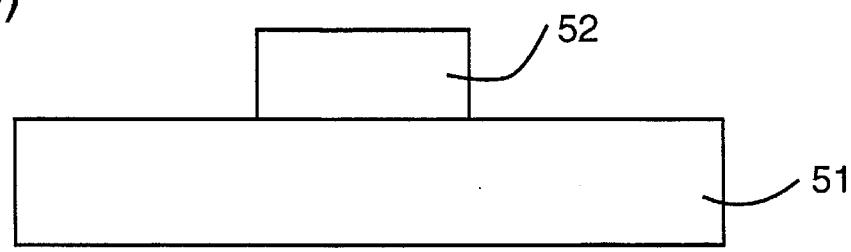
Figure 5D:
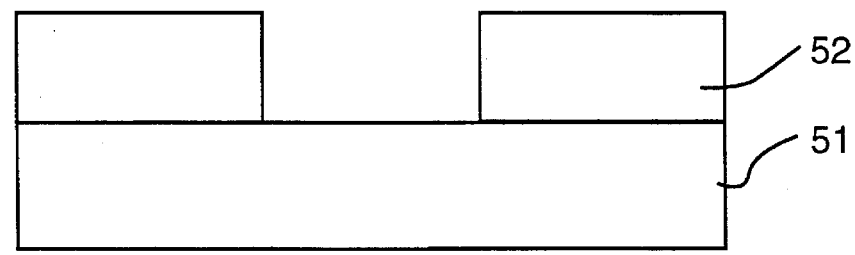

In FIG. 3(a), a substrate 31 is shown and a seed material film 33 is formed thereon, as shown in FIG. 3(b). The seed material film 33 has different surface properties from those of the substrate and is selectively formed in an exposed region by energy beams 32. Generally, the formation of the seed material is achieved by decomposing a gas to form an ultra thin film of the seed material on the exposed region. Thereafter, the oriented material 34 is formed on the formation portion of seed material film 33 as the material layer to form a fine pattern, as shown in FIG. 3(c). Alternatively, as shown in FIG. 4, a substrate 41 having a seed material film 42 formed by decomposing gas and exposing the substrate to energy beams is formed so that the oriented material 43 can be formed at portions other than portion 42. In this way, both positive and negative patterns can be formed.

According to the present invention, the seed area of the pattern is selectively formed on the substrate and then the oriented material is deposited for constituting the pattern. Conventionally, however, the resist pattern is obtained by performing a developing step after the result is exposed to the energy beams. According to the present invention, a seed area of the first pattern is formed by an extremely thin film comprising molecules or basic units having a small size, so that the surface corrugation can be suppressed and resolution improved. The proximity effect can be reduced as a result of using the thin film pattern formation method of the present invention.

The possibility of improving sensitivity is also achieved. The oriented material is used for practical pattern formation and the problem of surface corrugation of the pattern is suppressed by the present invention. In addition, since the seed area is removed or is extremely thin, it does not render any problem for dry etching and ion implantation which are carried out in succession to form the pattern.

EXAMPLE 1

Silicon is used as the substrate material in a preferred embodiment. Alternatively the substrate material may be GaAs, InP, or a metal substrate such as Al, or an insulating substrate such as silicon dioxide as well as a multi-layer substrate material. With silicon, the surface is highly hydrophilic as a result of the native oxide film formed thereon. A hydrophobic treatment of the substrate surface is performed by vapor deposition of hexamethyl disilazane on the surface of a substrate. This is accomplished in a conventional manner, for example, by heating the substrate 11 on a hot plate to 100° C. in a vacuum chamber pumped down to a vacuum of $10^{-3}$ Pa, for example. Vaporized HMDS is introduced in the chamber for deposition on the substrate. Following the deposition of the HMDS, the chamber pressure is returned to atmospheric pressure and a substrate having HMDS as the seed material film 12 formed thereon is obtained, as shown in FIG. 1(a). As a result, a hydrophobic surface film having lower hydrophilicity than the surface of the substrate 11 is obtained. Since the molecular weight of HMDS is as small as 161 and the size of one molecule is about 2 nm, the film can be formed extremely thin, for example with about 1 nm thickness. Also, HMDS has a low resistance to dry etching by a reactive ion etching method.

Preferably, electron beam lithography is used to form a pattern on the seed material film 12. Specifically, electron beams having an acceleration voltage of 5 kV, for example, are exposed in accordance with a desired pattern to form the latent image 14 on the seed material film 12. The electron beams selectively vaporize and remove portions of the film 12, as a result. The dosage required for removal of the film 12 is about 0.1 μC/cm². The resultant pattern showing a portion of the seed area removed by the electron beam exposure step is shown in FIG. 1(c). After removal of the portion of thin film 12, the substrate surface, which is hydrophilic, is exposed. Since the thin film 12 is hydrophobic and the substrate surface hydrophilic, there is a different hydrophilicity between the surfaces. Accordingly, an LB film can be selectively deposited on the substrate.

An oriented material is formed on the exposed portions of the pattern, as shown in FIG. 1(d). For example, an arachic acid can be used as one example of a normal chain fatty acid in forming the oriented material 15. Arachic acid has linear molecules with a length and width of about 2.5 nm and 0.5 nm, respectively. Therefore, the oriented monomolecular film 15 is aligned with a period of about 0.5 nm and has a similar periodic structure to the LB film formed homogeneously. Pure water containing calcium ions in a concentration of $4 \times 10^{-4}$ mol/l, for example, is used as a sub-phase liquid in forming the oriented material film. The sub-phase liquid is kept at 20°, for example. The substrate 11 is immersed in the sub-phase liquid. Then, a solution of chloroform, used as a solvent, and arachic acid, having a concentration of $3 \times 10^{-3}$ mol/l, for example, is added to and spread across the sub-phase liquid surface. A compression board is gradually moved in the manner explained with reference to FIG. 6(b) until an oriented monomolecular film of arachic acid is obtained. A surface pressure of 30 mN/m, for example, is achieved at which the oriented monomolecular film occurs in a stabilized state. The substrate 11 is then raised at a rate of 10 mm/min, for example, and when completely withdrawn, a single-layered LB film of arachic acid is selectively formed on the substrate in the regions where the HMDS film 12 had been removed by the electron beam lithography.

In electron lithography, finely focused electron beams can expose a region of 5 nm, for example, thus forming an ultra fine pattern. Since the film 12 of HMDS has a thickness of about 1 nm, the proximity effect due to the scattering of the electron beams during patterning can be reduced, and the region removed by the electron beams is made equivalent to the exposed region. Since HMDS has a molecule size as small as about 2 nm, and the HMDS is removed at the molecular level, the corrugation at the end portions of the removed region can be limited to the size of a molecule. Arachic acid has a period of about 1 nm and is deposited on the regions having the small corrugations at the pattern edge portions to form the desired pattern. Accordingly, an ultra fine pattern having minimum surface corrugation is obtained by the method of the present invention. Since the pattern is formed in the exposed region, the pattern formed is a negative type pattern.

After the pattern is formed in the manner described above, the substrate is etched by a known etching method having high selectivity such as reactive ion etching to obtain a desired pattern. Then, selective ion implantation or diffusion can follow to provide impurity regions.

In the foregoing example, HMDS is used as the seed material film 12, electron beams are used as the energy beams 13 and arachic acid is used as the oriented material 15. However, the present invention is not limited to these materials and energy beam exposure method. The seed material must have a different surface property, hydrophilicity, from that of the substrate, and therefore silane compounds generally referred to as silane couplers, inclusive of HMDS, can be used. Such silane couplers are methyltrimethoxysilane, methyltriethoxysilane, vinyltrimethoxysilane, methyltrichlorosilane, dimethydichlorosilane, trimethylchlorosilane, etc. Organic compounds used a sensitizer of the resist, such as polymethylpentene sulfone (PMPS) can also be used. Inorganic compounds such as ionic crystals, e.g. silver chloride (AgCl) and sodium chloride (NaCl), and covalent bond crystals e.g. silver selenide ($Ag_2Se$), selenium (Se) and tellurium (Te), can also be used. The length or width of these molecules or basic units is less than 10 nm, and they are therefore suitable for forming a pattern having a fabrication dimension of below about 100 nm. In addition to using a vapor deposition method as discussed above, the thin film can be formed by a spin coating method, by forming a reaction in a solution of anodic oxidation, for example, or by utilizing a vacuum deposition method. As an alternative to using electron beams, energy beams 13 may be ultraviolet rays, deep UV rays, X-rays, ion beams, gamma rays, etc., as long as the energy beams apply sufficient energy to the seed material film 12 for removing the film in the exposed portions. Besides arachic acid, it is possible to use as the oriented material 15, normal chain fatty acids such as behenic acid, fatty acids containing a double bond such as tricosenoic acid, and the LB films of polymer materials such as polyimide and novolak resin. The oriented material is not limited to an LB film since it is also possible to use liquid crystals of p-azoxyethyl benzoate, p-azoxyethyl cinnamate, p-azoxyethyl cinnamate, ionic crystals such as silver chloride (AgCl), sodium chloride (NaCl), etc., and covalent bond crystals such as silver selenide ($Ag_2Se$), selenium (Se) and tellurium (Te). Further, a cresol novolak resin of a preferred mixture to be discussed in greater detail hereinafter can be used.

EXAMPLE 2

In the first example of the invention, the oriented material 15 is formed on the removed regions of the seed material film 12, as shown in FIG. 1(d). The method of depositing the thin film on the substrate can be readily modified by immersing the substrate in the sub-phase liquid before adding the oriented molecular material so that the molecules are deposited on the exposed portions during removal of the substrate from the sub-phase liquid.

In example 1, the pattern is formed on the seed material, and this pattern forming step is followed in example 2, however the substrate is immersed in the sub-phase liquid before the oriented material is spread across the surface of the liquid. A compression board is used to generate a surface pressure of 30 mN/m, for example, in order to develop a stabilized monomolecular film. Then, the substrate is lowered down into the sub-phase liquid at a rate of, 10 mm/min., for example. The arachic acid is selectively deposited on the portions of the substrate that are not exposed, i.e. that have the HMDS thin film as a hydrophobic portion. After the substrate is lowered completely into the sub-phase liquid, the oriented molecular film on the surface of a sub-phase liquid that has not been deposited is drawn off of the sub-phase liquid surface and removed. Then, the substrate is moved up at a rate of 10 mm/min, for example, from the sub-phase liquid. In this way, it is possible to obtain a single-layered LB film of arachic acid as an oriented material selectively adhered to only the unexposed regions of the seed material film 22 formed on substrate 21.

Since the exposed pattern portions are removed by the energy beams, the pattern formation that is generated by the method of this example is a positive type pattern. Though HMDS remains after the pattern formation steps, it does not affect etching, ion implantation or selective introduction of impurity regions by diffusion since the HMDS does not have etching resistance and its film thickness is insignificantly thin.

EXAMPLE 3

In a third embodiment of the invention, the energy beams are used to expose portions of the seed material that will be retained in forming the pattern. Specifically, silicon is used as a substrate and electron beams 32 are used to expose a silicon substrate using conventional electron lithography, as shown in FIG. 3(b). The electron beams are accelerated at 5 kV, for example, and substrate 31 is exposed with a desired pattern. The electron beam writing machine is maintained at a high vacuum with a vacuum pump, but trace amounts of carbon compounds such as carbon dioxide remain. The carbon compounds absorb the energy from the electron beams and are decomposed. As a result, an ultra thin film of carbon is formed on the exposed region. Depending on the degree of vacuum and the dose of the electron beams, a 2 nm ultra thin film of carbon can be obtained. For example, such a film can be obtained at a vacuum of $10^{-5}$ Pa with an electron beam dosage of 1 $\mu C/cm^2$. In this way, a material layer having a different surface property from that of the silicon substrate, which is hydrophilic as a result of the surface oxide layer, can be introduced selectively by the energy beams. The ultra thin film of carbon is used as the seed material film 33 for forming the pattern.

Substrate 31 with seed material film 33 are then returned to atmospheric pressure and placed in an LB film forming apparatus. Arachic acid, as one of the normal chain fatty acids, is used to form the oriented material 34, as shown in FIG. 3(c). Pure water containing $4 \times 10^{-4}$ mol/l of calcium ions, for example, is used as the sub-phase liquid, which is maintained at 20° C., for example. Chloroform is used as a solvent, for example, and arachic acid is dissolved in the solvent in a concentration of $3 \times 10^{-3}$ mol/l, for example. The substrate is positioned above the sub-phase liquid before the arachic acid is spread across the surface of the sub-phase liquid. Then, the compressing board is moved to form a stabilized monomolecular film of arachic acid along the surface of the sub-phase liquid. Compression is carried out until the surface pressure reaches 30 mn/m, for example. The substrate is then lowered at a rate of 10 nm/min and the arachic acid is deposited selectively on the substrate where the ultra thin film of carbon exists as a hydrophobic portion, i.e. the portion exposed by the electron beam when the pattern was formed. After lowering the substrate in the sub-phase liquid, the remaining monomolecular film not deposited is withdrawn and removed from the sub-phase liquid. The substrate is then taken out from the sub-phase liquid and returned to the atmosphere. A single layered LB film of arachic acid as the oriented material 34 is formed selectively on the seed material film 33 and not on the surface of the substrate 31, as shown in FIG. 3(c). This pattern formation is of a negative type.

Although the seed material is formed by decomposing residual carbon compounds, such as carbon dioxide, a carbon containing gas such as $CH_4$ (methane) can be diluted and introduced into the vacuum chamber during the electron beam exposure for forming the carbon film. In this way, the electron beam dosage can be reduced and a higher sensitivity can be achieved. An ultra thin film of silicon can be obtained in a similar manner by introducing the silicon containing gas such as $SiH_4$ (silane). Since the resulting silicon surface is not oxidized, it is hydrophobic to an extent sufficient for use in the present invention. Further, it is possible to use other gases that can be decomposed by exposure to the energy beams in order to form a compound of the elements contained in the gas which has a different hydrophilicity from that of the compound. Since the length or width of the molecules of the basic unit is less than 10 nm, this method is suitable for forming a pattern having an etching dimension of below 100 nm.

EXAMPLE 4

In example 3, the substrate has an LB film formed on the seed film 33 by positioning the substrate above the sub-phase liquid and lowering it into the water once the monomolecular film is formed across the surface of the sub-phase liquid. In example 4, the seed portion of the pattern is formed in the same way as in example 3, but the substrate is immersed in the sub-phase liquid before the oriented material is spread across the sub-phase liquid. Compression is carried out to obtain a surface pressure of 30 mN/m, for example, to develop a stabilized monomolecular film across the surface of the sub-phase liquid. Then, the substrate is moved up from its previously immersed state at a rate of 10 mm/minute, and contrary to the LB film deposited on the substrate in example 3, the arachic acid is selectively deposited on the portions not covered with the ultra thin film of carbon. In this way, a single layered LB film of arachic acid has an oriented material 43 selectively formed on only the region of the substrate 41 where the seed material film 42 is not formed, as shown in FIG. 4.

The pattern formed by the procedure followed in example 4 is a positive type pattern. Although the material layer remains after the pattern formation, it is an ultra thin film that does not affect etching, ion implantation or selective introduction of an impurity region by diffusion after the pattern is formed. In the foregoing examples, the LB film that is deposited is a Y film, but the present invention is not limited thereto and specifically LB film of X and Z films can be deposited, as well.

EXAMPLE 5

The foregoing embodiments disclose forming an LB film with a single layer of molecules. The present invention is not limited to forming a single layer in the deposition of the LB film, however. When multiple layers of the constituent molecules are formed, the surface of the seed material film 12 and the oriented material 15 both become hydrophilic and the region having the different hydrophilicity property on the substrate 11 when the first layer of the NB film is formed is now no longer present. Accordingly, when the substrate is immediately lowered selected adhesion of a second layer of the oriented material cannot be obtained.

Figure 8A:
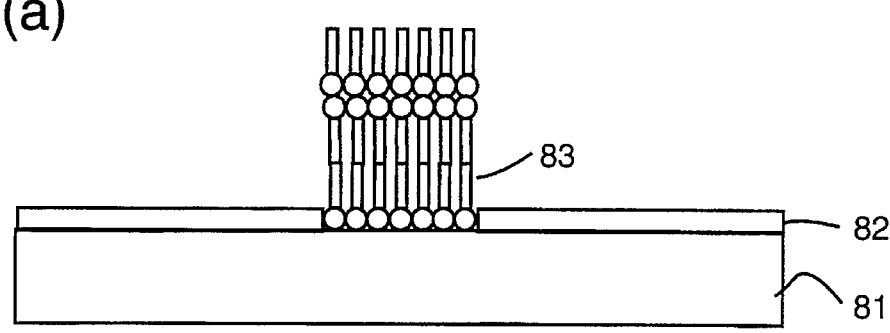
FIGS. 8(a), 8(b), 8(c) and 8(d) are explanatory views of the present invention.

According to this example of the invention, ultraviolet rays having a wave length of 365 nm are applied for one second on the surface of the substrate 11, the seed material film 12 and the oriented material 15. Selectivity of the difference of the surface properties obtained in forming the first layer is recovered by this method. In this way, the second layer can be deposited by lowering the substrate 11. A third layer and so forth can be made by securing selectivity by similar UV ray exposure steps. In this way, the oriented material 83 can be selectively deposited in multiple layer films on the portion of the substrate 81 not covered with the seed material film 82, as shown in FIG. 8(a). The thickness of the film after the pattern formation can thus be increased, if desired.

Figure 8B:
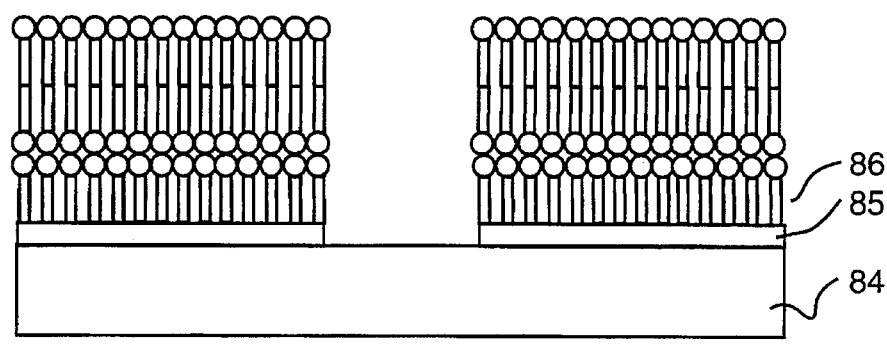
Figure 8C:
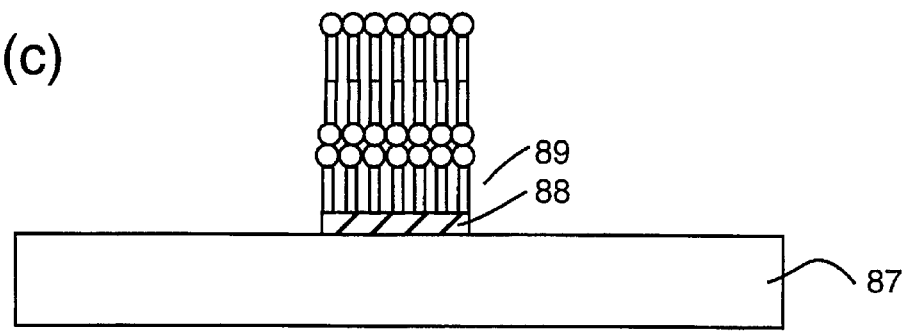
Figure 8D:
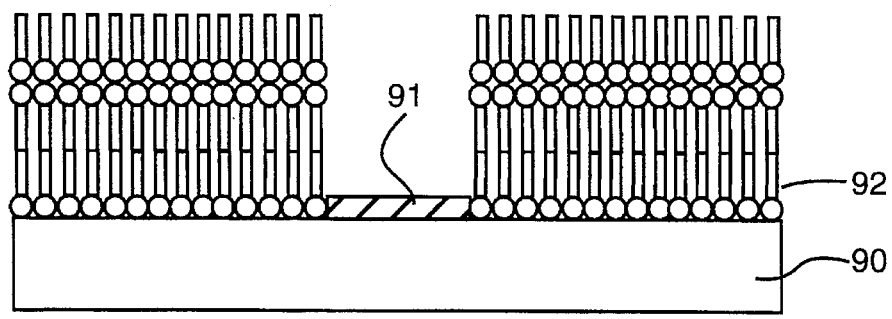

In other situations, it may be preferable to have an oriented material 86, 89 and 92 selectively deposited on the multiple layer thin film on the basis of the pattern formed on the seed material films 85, 88 and 91, respectively, as shown in FIGS. 8(b)–8(d).

The beams for exposing the substrate are not limited to UV rays of 365 nm, and beams having other wave lengths may also be used. Also, not only exposure by the beams, but also overheating of the substrate may be used to recover selectivity in this example.

EXAMPLE 6

As in example 5, when the LB film to be formed in an X film or a Z film, the second layer and so forth adhere to the first layer. Therefore, exposure of the UV rays affected in example 5 becomes unnecessary and the multiple films can be formed by repeating the normal submersion and lifting out of the substrate. In this way, the oriented material 102 can be deposited selectively on the portion of the substrate 100, as shown in FIGS. 9(a)–9(d) that are not covered with the seed material film 101. In this way, the thickness of the pattern can be increased during the film depositing procedure.

Figure 9A:
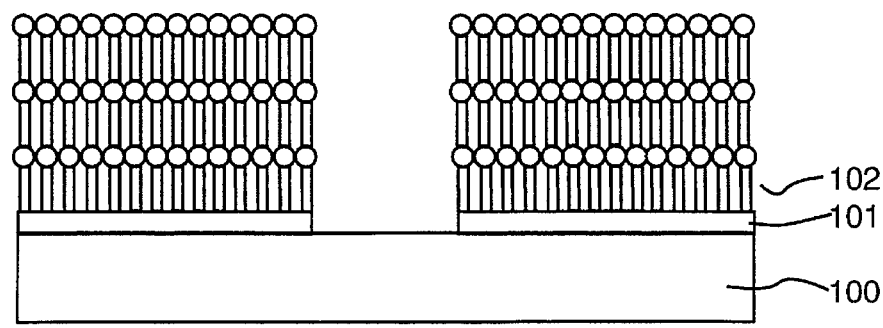
FIGS. 9(a), 9(b), 9)c) and 9(d) are explanatory views of the present invention.
Figure 9B:
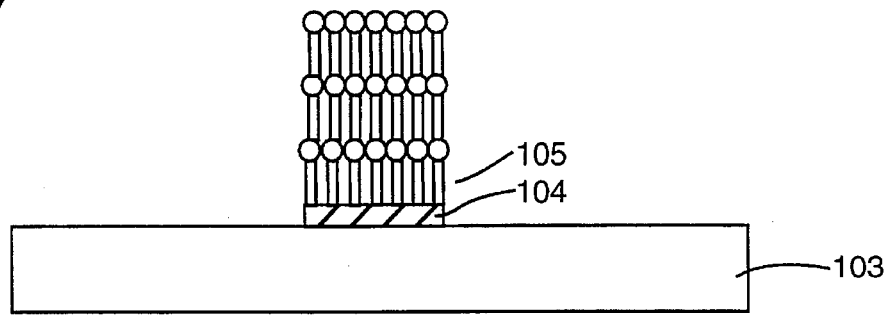
Figure 9C:
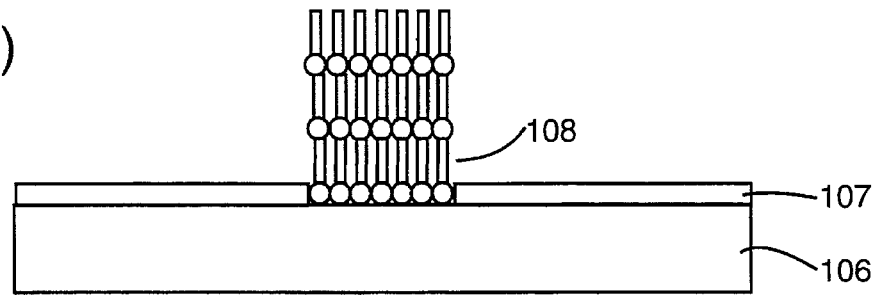
Figure 9D:
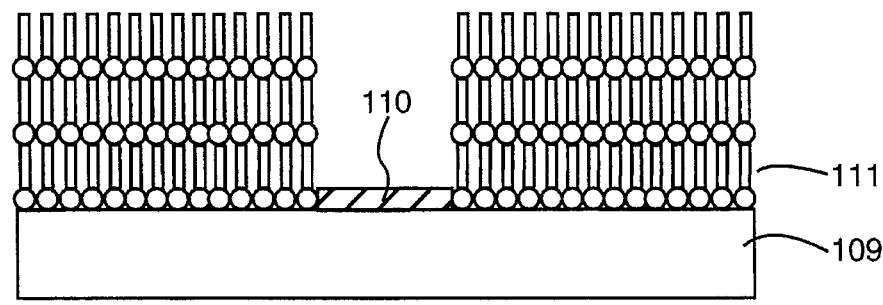
Figure 10A:
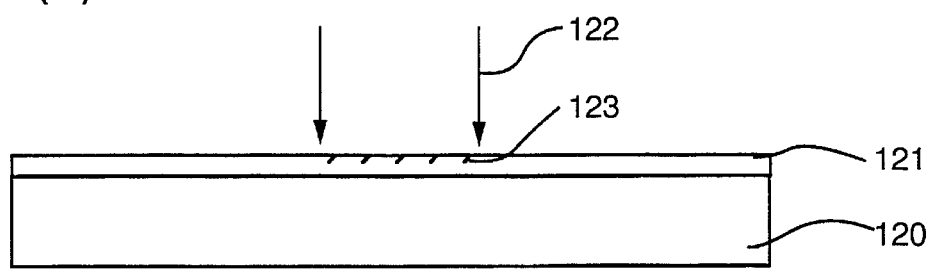
FIGS. 10(a) and 10(b) explain a pattern formation method of the prior art.
Figure 10B:
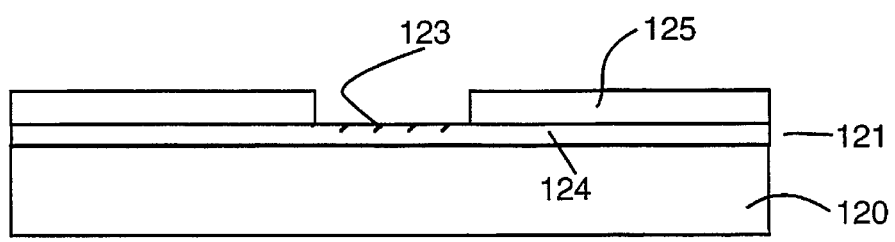

If the oriented material 105, 108 and 111 can be selectively deposited in the form of multiple films on the basis of the pattern formed on the seed material films 104, 107 and 110, as shown in FIGS. 9(b)–9(d).

Though the foregoing embodiments and examples of the invention disclose forming a pattern on a flat substrate, the procedures can be carried out similarly for substrates having steps. When a step exists on the substrate, the seed material film adheres thinly and uniformly on the horizontal and vertical portions. Therefore, fine etching can be achieved. Though the example when the substrate is disposed vertically to the sub phase liquid as the formation method of the LB film has been explained, the present invention is not limited thereto. Rather, the substrate can be disposed horizontally with respect to the sub-phase liquid or at an angle with respect thereto.

In the foregoing examples, arachic acid is disclosed as the preferred oriented material, but the invention is not limited to using arachic acid. It is possible to use an LB film of a normal chain fatty acid such as behenic acid besides arachid acid, fatty acids containing a double bond such as tricosenoic acid, or polymer materials such as polyimide and novolak resin, as the oriented material. The oriented material is not limited to the LB film, and liquid crystals such as p-azoxyethyl benzoate, p-azoxyethyl innamate, p-azoxyoctyl cinnamate, etc., ionic crystals such as silver chloride (AgCl) and sodium chloride (NaCl), and covalent bond crystals such as silver selenide ($Ag_2Se$), selenium (Se), and tellurium (Te), etc., can be used.

Figure 11A:
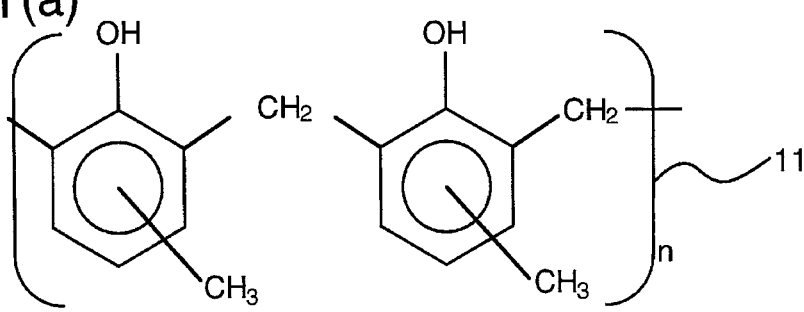
FIG. 11(a) is a diagram showing the structure of a cresol novolak resin.
Figure 11B:
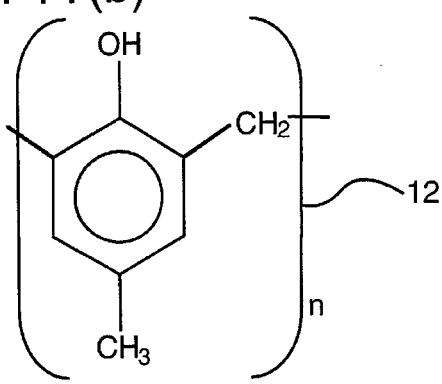
FIGS. 11(b), 11(c), 11(d), and 11(e) are diagrams showing the structures of p-cresol novolak and m-cresol novolak.
Figure 11C:
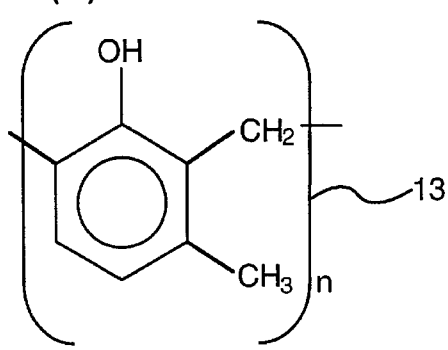
Figure 11D:
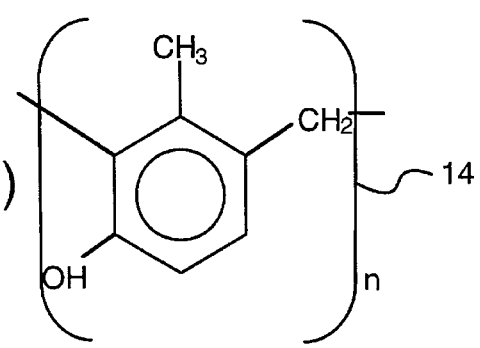
Figure 11E:
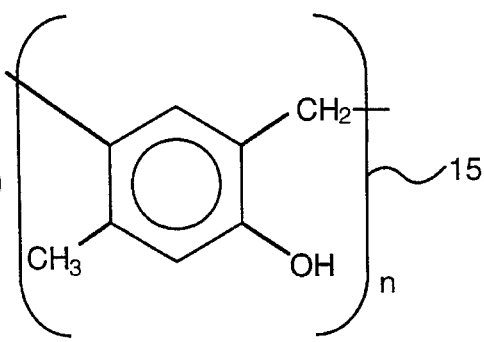

According to a preferred embodiment of the invention, a LB film is formed of a cresol novolak resin 11 shown in FIG. 11(a), which is a mixture of two isomers, p-cresol novolak 12 shown in FIG. 11(b) and m-cresol novolak 13–15 shown in FIGS. 11(c) to 11(e). There is a difference in the positional relation of the OH radical and $CH_3$ radical as shown in FIGS. 11(b) to 11(e). The m-cresol novolak may be any one of the members shown in FIGS. 11(c) to 11(e) and the structural formula used in the mixture need not be of only one kind.

In p-cresol novolak, the OH radical is the hydrophilic radical and the $CH_3$ radical is the hydrophobic radical. They are symmetrically bonded with an aromatic ring between them as shown in FIG. 11(b). When this compound is spread on the surface of a sub-phase liquid, the molecules are aligned in such a way that the OH radicals are in contact with the surface of the liquid. Therefore, the molecules are likely to be aligned in the same direction.

To form the LB film having high uniformity and high order orientation, it is important to provide a periodic arrangement of the molecules spread across the surface of the sub-phase liquid and compressed together. Accordingly, when cresol novolak resin comprising p-cresol novolak alone is used, the molecules take the ring structures on the water surface, but do not provide periodic structures so that an LB film having uniformity cannot be obtained, even though the cresol novolak resin comprising the p-cresol novolak alone has a stable ring structure due to the interaction between the atom.

For each of the isomers of the m-cresol novolak, the OH radical as the hydrophilic radical and the $CH_3$ radical as the hydrophobic radical are not symmetrically positioned about the aromatic ring, which is interposed between them, as shown in FIGS. 11(c) to 11(e). Accordingly, when the compound is spread on the sub-phase liquid surface, the direction of orientation of the molecules becomes disordered and a uniform monomolecular film is not easily obtained.

When a cresol novolak resin comprising a mixture of p-cresol novolak and m-cresol novolak is used, a balance can be established between the hydrophilic radical and the hydrophobic radical by controlling the proportion of p-cresol novolak to m-cresol novolak. When the proportion of p-cresol novolak is at least 20% but less than 100%, a good balance is obtained. In this case, the monomolecular film can be formed on the surface of the sub-phase liquid and an orientation structure having uniformity in which the hydrophilic radicals face in one direction can be obtained. By the present invention, an LB film can be formed, and this film formation has been confirmed experimentally. When the proportion of p-cresol novolak is greater than 50% but less than 100%, the film formation can be formed more reliably, and this result has also been confirmed experimentally. Upon examination of the molecular structure models and through experimentation with a cresol novolak resin having more preferably a proportion of p-cresol novolak of at least 60% but less than 80%, a uniform and stable film can be formed on the substrate. Through experimentation, it has been determined that a 70% proportion of p-cresol novolak is the best made. Accordingly, it is possible to obtain a thin film having high uniformity and high order orientation applicable for use as a high resolution resist.

EXAMPLE 7

Figure 12A:
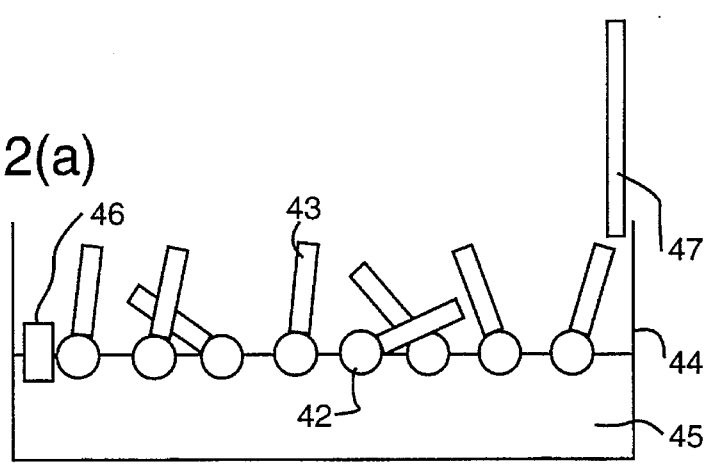
FIGS. 12(a), 12(b), 12(c) and 12(d) explain the steps followed in a conventional pattern forming method.
Figure 12B:
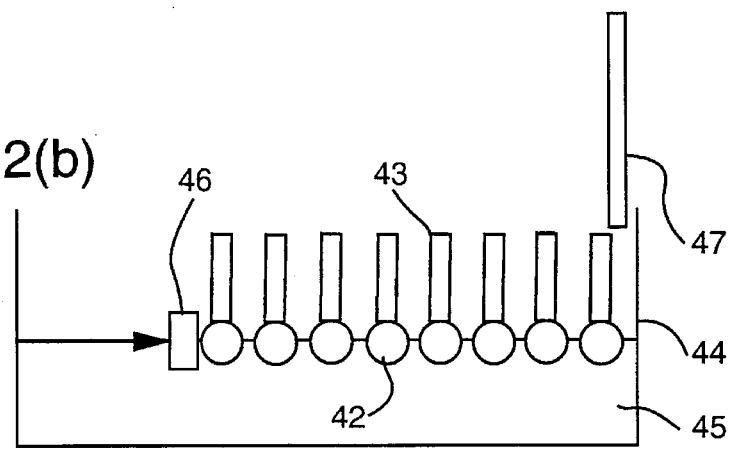
Figure 12C:
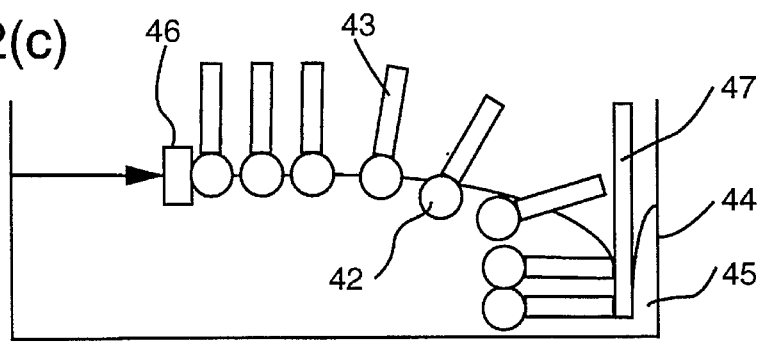
Figure 12D:
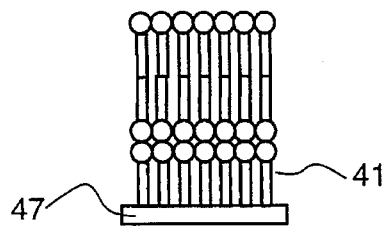

A cresol novolak resin having a proportion of p-cresol novolak is dissolved in a solvent such as isoamyl acetate in a concentration of 1.0 mg/ml, for example. The solution is passed through a filter of 0.2 micrometer, for example, for purification to obtain a solution of the film forming material that is spread across the surface of a sub-phase liquid 45, as shown in FIGS. 12(a). Using an LB deposition apparatus, the substrate, which is a silicon substrate, for example, having the HMDS hydrophobic treatment of the foregoing embodiments is deposited with a LB film of the cresol novolak resin. Specifically, 25 µl of the cresol novolak-isoamyl acetate solution is spread across the surface of sub-phase liquid 45 of pure water, for example, maintained at 30° C. The surface pressure is raised to 5 mN/m to force an oriented monomolecular film to be formed on the surface of the water as shown in FIG. 12(b). While the surface pressure is kept constant, the substrate 47 is lowered at a rate of 2 mm/min, for example, in a vertical direction across the surface of the water, as shown in FIG. 12(d). After the substrate 47 is moved down, the monomolecular film on the lower layer liquid 45 that does not adhere to the substrate 47 is withdrawn and removed, and the substrate is then withdrawn from the sub-phase liquid at a rate of 10 mm/min, for example. In this way the LB film of a single layer of the novolak resin is deposited on the substrate. Upon evaluation by a known atomic force microscope, it is confirmed that the LB film is uniform and highly ordered.

Modifications of the embodiment are considered to be within the scope of the present invention. For example, a similar effect can be obtained by using a substrate subjected to hydrophilic treatment before the LB film is deposited.

EXAMPLE 8

The embodiment of example 7 forms a single layer LB film, however, the following embodiment discloses depositing a multiple layer LB film on the substrate.

Figure 7A:
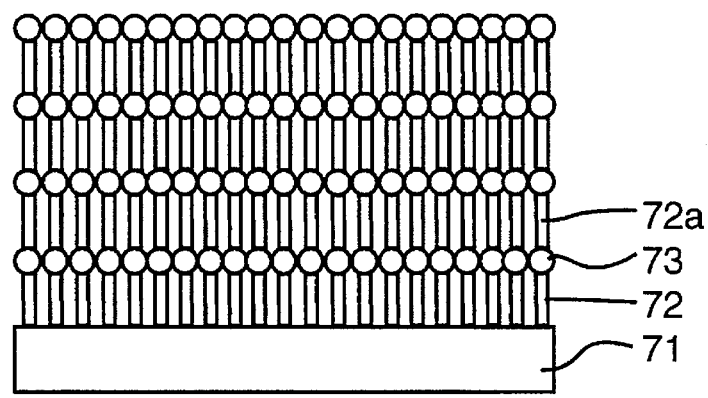
FIGS. 7(a), 7(b), and 7(c) show schematic representations of several kinds of LB film.
Figure 7B:
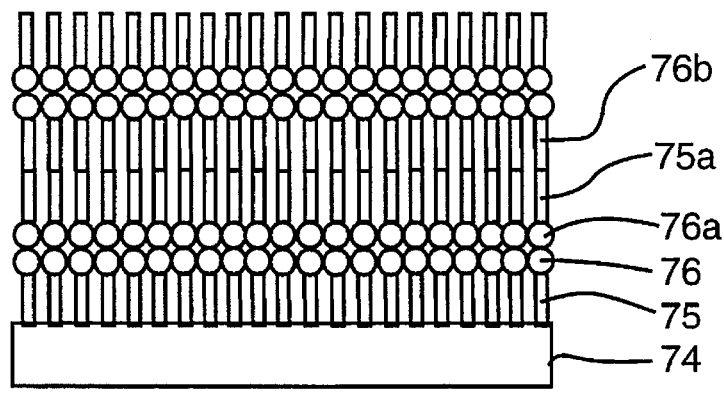
Figure 7C:
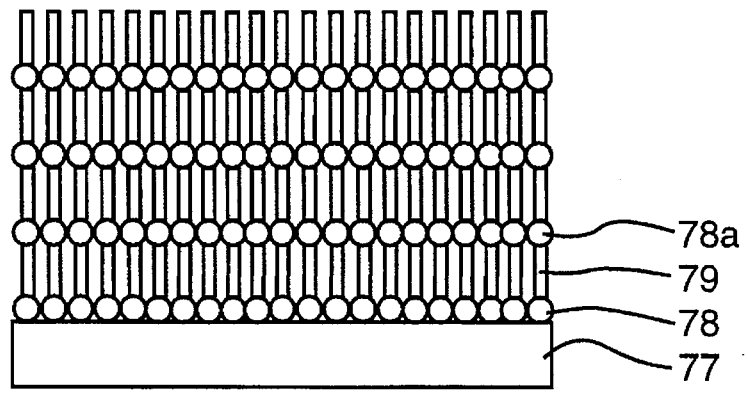

To form the multiple layers, the procedure described with respect to example 7 is followed, except that after the lowering of the substrate 47 into the sub-phase liquid is completed, the substrate 47 is then raised at a rate of 2 mm/min., for example, while the surface pressure is kept constant. After raising the substrate, a two layer LB film is obtained. The subsequent immersion step forms a third layer and, if a fourth step of raising the substrate again is performed without withdrawing and removing the cresol novolak from the surface of the sub-phase liquid, a fourth layer of the MB film is formed, and so on. Actually, a multilayer film as shown in FIG. 7(a)–7(c) can be formed by using the sequential immersion and raising step of the substrate in the sub-phase liquid, as has been explained. Preferably the film thickness is in the range of 1 nm to 100 nm.

EXAMPLE 9

Figure 13A:
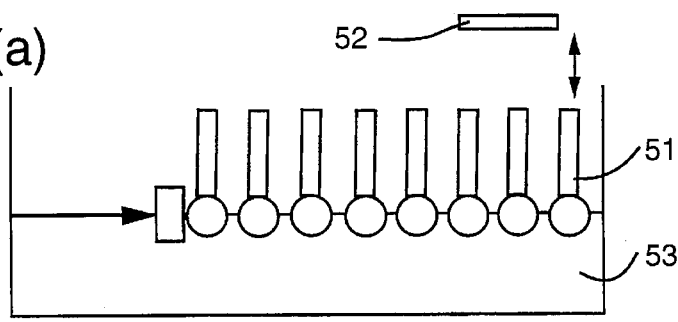
FIGS. 13(a)–13(b) are explanatory views of forming an LB film.
Figure 13B:
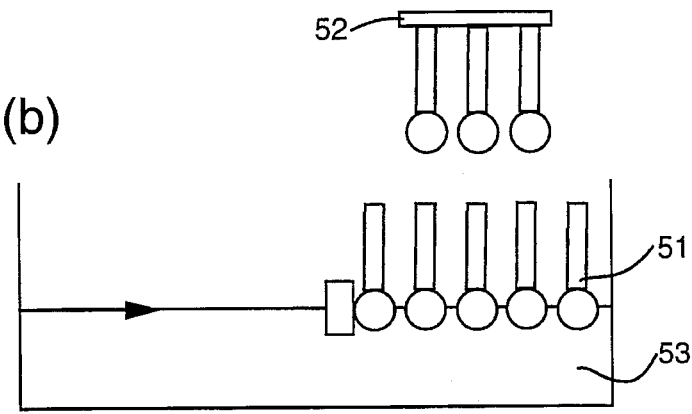
Figure 14A:
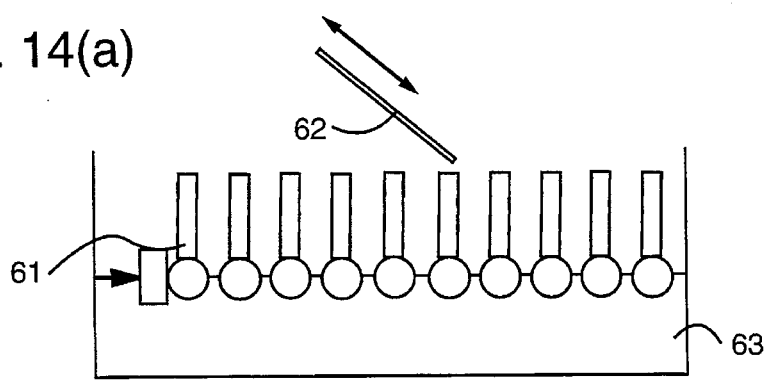
FIGS. 14(a)–14(b) are explanatory views of forming an LB film.
Figure 14B:
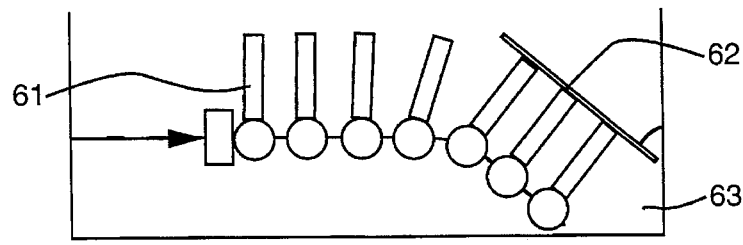

As will be explained with reference to another embodiment, the vertical submersion and raising of the substrate in the sub-phase liquid is not necessary since the substrate can be disposed horizontally with respect to the surface of the sub-phase liquid, as shown in FIGS. 13(a) and 13(b). Specifically, substrate 52 is disposed horizontally with respect to sub-phase liquid 53. Alternatively, a substrate, such as substrate 62, can be disposed at an angle with respect to the surface of sub-phase liquid 63, as shown in FIGS. 14(a) and 14(b).

The method of forming the LB film when the substrate 52 is disposed horizontally with respect to the surface of the sub-phase liquid 53 is performed as follows. First, a silicon substrate, for example, previously subjected to a hydrophobic treatment by HMDS, is disposed horizontally to the surface of sub-phase liquid 53. The cresol novolak resin used in forming the film is present on the surface of the sub-phase liquid, and the surface pressure is kept constant. The substrate 52 is lowered at a rate of 2 mm/min, for example. When the substrate 52 contacts the surface of sub-phase liquid 53, the substrate 52 is stopped for 5 seconds, for example, and then raised back up at a rate of 2 mm/min, for example. In this way, a single layered LB film is obtained on the substrate 52, as shown in FIG. 13(b).

Of course, the moving seed of 2 mm/min and the stopping time of 5 seconds is preferred, but the scope of the invention is not limited to these examples.

A method of forming an LB film when the substrate is disposed at an angle to the surface of the layer 63 will be discussed herein with reference to FIGS. 14(a) and 14(b). A silicon substrate subjected to hydrophobic treatment is used, as in the previous example. The substrate is disposed at a 45° angle, for example, to the surface of the sub-phase liquid 63. The cresol novolak resin is oriented as a monomolecular film on the surface of the sub-phase liquid with a constant surface pressure. The substrate is moved into the sub-phase liquid at a rate of 2 mm/min maintaining the 45° angle with respect to the surface of the sub-phase liquid. In this way, a single layered LB film is obtained on the substrate.

The angle of the substrate to the surface of the subphase liquid is disclosed as being 45° and the speed of moving the substrate at this angle into the sub-phase liquid is disclosed as being 2 mm/min, but the present invention is not limited to these angles and speeds. Similarly, the horizontal and sloped disposition of the substrate with respect to the sub-phase liquid permits a method of forming more than just one layer of LB film, even though only single layered LB films are shown.

By the present invention, a uniform LB film having high order orientation can be applied to obtain a high resolution resist by controlling the proportion of components of the cresol novolak resin as the film forming materials. Once pattern formation is carried out using electron beams, for example, energy beams and lithography using this film, a pattern of below 0.1 µm can be formed.

Although several examples of the invention have been discussed, the invention is not limited thereto. Many modifications are possible within the broad aspects and teachings of the disclosure.

We claim:

1. A pattern formation method comprising the steps of:

forming a pattern of a thin film of a seed material coated on a surface of a substrate, wherein a surface hydrophilicity characteristic of said seed material differs from a hydrophilicity characteristic of said substrate surface; depositing an oriented material film on one of said seed material or said substrate surface; and wherein said oriented material film is a Langmuir Blodgett film of a cresol novolak resin having a proportion of p-cresol novolak to m-cresol novolak of at least 20 wt. %.

2. A pattern formation method according to claim 1, wherein the pattern is formed by exposing the thin film surface with energy beams to form the pattern by selectivity vaporizing and removing portions of the thin film.

3. A pattern formation method according to claim 2, wherein said seed material is hexamethyl disilazane.

4. A pattern formation method according to claim 2, wherein said surface of the substrate is hydrophilic and the surface of the thin film is hydrophobic and the oriented material is formed on a region where the thin film has been removed.

5. A pattern formation method according to claim 3, wherein said hexamethyl disilazane is formed about 1 nm thick.

6. A pattern formation method according to claim 1, wherein said seed material is a silane coupler.

7. A pattern formation method according to claim 1, wherein said energy beams are one of ultra-violet rays, X-rays, ion beams, electron beams and gamma rays.

8. A pattern formation method according to claim 1, wherein said substrate is one of silicon, GaAs, InP, Al and $SiO_2$.

9. A method of forming a pattern used in semiconductor lithography, comprising the steps of:

coating a substrate with a seed material, said substrate having a hydrophilicity characteristic different from that of said seed material;

removing portions of said seed material thereby forming removed and non-removed portions of said seed material;

depositing an oriented material on one of said removed and non-removed portions according to said different hydrophilicity characteristics, wherein said oriented material film is a Langmuir Blodgett film of a cresol novolak resin having a proportion of p-cresol novolak to m-cresol novolak of at least 20 wt. %.

10. A pattern formation method according to claim 9, wherein said removing is performed by vaporizing with an electron beam.

11. A pattern formation method according to claim 9, wherein said seed material is hexamethyl disilazane.

12. A pattern formation method according to claim 9, wherein said pattern is formed by exposing said seed material thin film to one of ultra-violet rays, X-rays, ion beams, electron beams and gamma rays.

13. A pattern formation method used in semiconductor lithography, comprising the steps of:
   coating a substrate with a seed material, said substrate having a hydrophilicity characteristic different from that of said seed material;
   forming a pattern by removing portions of said seed material thereby forming removed and non-removed portions of said seed material;
   depositing an oriented material film on one of said removed and non-removed portions according to said different hydrophilicity characteristics;
   wherein said oriented material is a Langmuir Blodgett film of a cresol novolak resin having a proportion of p-cresol novolak to m-cresol novolak of at least 20 wt. %.

14. A method of forming a pattern used in semiconductor lithography, comprising the steps of:
   forming a pattern on a substrate with a seed material, said substrate having a hydrophilicity characteristic different from that of said seed material, said seed material being deposited on said substrate by applying energy beams in a vaccum to the substrate surface in the presence of a material that is decomposed by the energy beams and that deposits on the substrate to form the pattern;
   depositing on oriented material on one of said substrate and said seed material, wherein said oriented material is one of a normal chain fatty acid, a polymer material silver chloride, sodium chloride, silver selenide, selenium, tellurium and a liquid crystal.

15. A pattern formation method according to claim 14, wherein said energy beams are electron beams, said substrate is silicon having a surface oxide layer that is hydrophilic and said pattern is formed by decomposition of carbon containing compounds to form the pattern with a carbon layer on the substrate that is hydrophobic.

16. A pattern formation method according to claim 14, wherein said oriented material is said liquid crystal which comprises one of p-azoxyethyl benzoate and p-azoxyethyl cinnamate.

17. A pattern formation method according to claim 14, wherein in said depositing step a first Langmuir Blodgett film of the oriented material is deposited in a first layer in one hydrophilic/hydrophobic orientation, and then the substrate and the first Langmuir Blodgett film are exposed to ultra-violet radiation or heated sufficiently to create selectivity with respect to deposition on the first Langmuir Blodgett film and the substrate so that in a subsequent depositing step, a second Langmuir Blodgett film of the oriented material having a second hydrophilic/hydrophobic orientation is deposited on the first layer without being deposited on the substrate.

18. A pattern formation method according to claim 14, wherein in said depositing step a first Langmuir Blodgett film of the oriented material is deposited in a first layer in one hydrophobic orientation, and then a second Langmuir Blodgett film of the oriented material having the same hydrophilic/hydrophobic orientation is deposited on the first Langmuir Blodgett film without being deposited on the substrate.

19. A pattern formation method according to claim 14, wherein said substrate is one of silicon, GaAs, InP, Al and $SiO_2$ and said seed material is carbon.

20. A pattern formation method according to claim 14, wherein said oriented material is fatty acid which contains tricosenoic acid.

21. A pattern formation method according to claim 14, wherein said oriented material is said polymer material which is polyimide.

22. A pattern formation method used in semiconductor lithography, comprising the steps of:
   forming a pattern on a substrate with a seed material, said substrate having a hydrophilicity characteristic different from that of said seed material, said seed material being deposited on said substrate by applying energy beams in a vacuum to the substrate surface in the presence of a material that is decomposed by the energy beams and that deposits on the substrate to form the pattern;
   depositing an oriented material on one of said substrate and said seed material;
   wherein said oriented material film is a Langmuir Blodgett film of a cresol novolak resin having a proportion of p-cresol novolak to m-cresol novolak of at least 20 wt. %.

* * * * *